US006940419B2

United States Patent
Moransais

(10) Patent No.: US 6,940,419 B2
(45) Date of Patent: Sep. 6, 2005

(54) ADAPTABLE REMOTE CONTROL FOR ELECTRICAL APPLIANCES HAVING SEVERAL FUNCTIONS TO BE CONTROLLED

(76) Inventor: Charles Moransais, 12 rue Saint Pierre, 1700 Fribourg (CH)

( * ) Notice: Subject to any disclaimer, the term of this patent is extended or adjusted under 35 U.S.C. 154(b) by 0 days.

(21) Appl. No.: 10/454,235

(22) Filed: Jun. 3, 2003

(65) Prior Publication Data

US 2003/0193428 A1 Oct. 16, 2003

Related U.S. Application Data

(63) Continuation of application No. 09/508,951, filed as application No. PCT/FR98/02000 on Sep. 17, 1998, now abandoned.

(30) Foreign Application Priority Data

Sep. 19, 1997 (FR) .......................................... 97 11904

(51) Int. Cl.[7] ............................................. G08C 19/00
(52) U.S. Cl. ......................... 340/825.69; 340/825.22; 340/825.37; 340/825.72; 348/734; 341/176
(58) Field of Search ..................... 340/825.22, 825.37, 340/825.69, 825.72; 348/734, 164, 6; 341/176; 398/106, 112, 111

(56) References Cited

U.S. PATENT DOCUMENTS

| 4,728,949 | A | * | 3/1988 | Platte et al. ........... 340/825.37 |
| 5,629,868 | A | * | 5/1997 | Tessier et al. .............. 348/164 |
| 5,654,813 | A | * | 8/1997 | Whitworth ................... 398/111 |
| 5,726,645 | A | * | 3/1998 | Kamon et al. ......... 340/825.22 |
| 6,160,491 | A | * | 12/2000 | Kitao et al. ............ 340/825.69 |

* cited by examiner

Primary Examiner—Ario Etienne
Assistant Examiner—Yves Dalencourt
(74) Attorney, Agent, or Firm—Cantor Colburn LLP

(57) ABSTRACT

A remote control including a microprossesor with a first storage zone containing a file of trademarks of the main appliances available on the market, and a storage zone containing code files corresponding to various appliances of the different trade-marks stored in the first file, a system being provided for first selecting the trade-mark of the appliance to be controlled, for selecting from the code file of the trademark appliances, the file containing the control codes of the appliance concerned.

2 Claims, 1 Drawing Sheet

ADAPTABLE REMOTE CONTROL FOR ELECTRICAL APPLIANCES HAVING SEVERAL FUNCTIONS TO BE CONTROLLED

CROSS REFERENCE TO RELATED APPLICATION

This application is a continuation application of, and claims full benefits of, U.S. patent application Ser. No. 09/508,951 filed Jun. 9, 2000, now abandoned, which is a 371 of PCT/FR98/02000, filed Sep. 17, 1998, which is herein incorporated by reference in its entirety.

TECHNICAL FIELD OF THE INVENTION

The subject of the present invention is an adaptable remote control for electrical appliances having several functions to be controlled.

BACKGROUND OF RELATED ART

Numerous electrical appliances, such as televisions, video recorders or high-fidelity systems, are controlled by remote controls.

An appliance is delivered together with a remote control. However, it is not uncommon for the user, through negligence or accidentally, to damage his remote control, thereby requiring the latter's replacement.

A first solution consists in obtaining a remote control from the manufacturer of the relevant appliance. However, such spare remote controls are not always available in stock and are, for the user, expensive to purchase.

This is because the remote controls, using infrared transmission to modify this or that function, employ a coding which is individual to each appliance, within one and the same make. A remote control is therefore specific to a particular appliance.

It is known practice, especially through documents U.S. Pat. No. 5,654,714 and EP-A-0 577 267, to produce an adaptable remote control which contains the control codes for a certain number of appliances. Access to each control code is effected by keying into the keypad of the remote control unit a specific digital or alphanumeric code of at least four characters. Therefore, in order to select the control code for an appliance, one needs to employ a voluminous leaflet identifying the codes for accessing the various control codes. Apart from the difficulty in searching for and selecting the codes, the loss of the leaflet renders any subsequent configuring of the remote control difficult to carry out.

SUMMARY OF THE INVENTION

The aim of the invention is to provide such a remote control, which may be configured very rapidly and very simply by the user himself, without requiring prior study of a leaflet of very complex instructions.

To this end, the remote control to which it relates comprises a microprocessor possessing a first memory area containing a file of the makes of the main appliances on the market, and a memory area containing the files of the codes corresponding to the various appliances belonging to the various makes stored in the first file, means being provided so as to allow firstly the selecting of the make of the appliance to be controlled, then the selecting, within the files of codes of the appliances of this make, of the file containing the control codes for the relevant appliance.

The configuring of the remote control so as to adapt it to a particular appliance is done firstly by selecting the make of the appliance, then by selecting, within the make, the control code corresponding to the relevant appliance.

"According to a characteristic of this remote control, the selecting of the make of the appliance is achieved by pressing a predetermined button and simultaneously one or more other buttons successively, such as the numbering buttons, which each correspond to the identification of a make."

The packaging of the remote control, or the remote control's actual unit, can comprise a list of the makes of the appliances which can be controlled, together with an indication opposite each make, of the button to be actuated to obtain access to the file of the microprocessor corresponding to the appliances of this make. The operation to be performed is simple, since the code for selecting a make does not comprise more than two characters.

"According to another characteristic of the invention, the selecting of the codes corresponding to the type of appliance is achieved, after selecting the make, by pressing a second predetermined button and simultaneously one or more other buttons successively, such as the numbering buttons, until the selecting of the codes of the relevant appliance is achieved."

The user firstly presses the second predetermined button, and successively one or more other buttons, until the operation of the appliance is achieved.

Advantageously, after selecting a make from the file of the memory containing the makes of the main appliances on the market, the microprocessor automatically selects from the file of control codes, the most frequent code for the appliances of the relevant make.

Thus, in numerous cases, the selecting merely of the make of the appliance makes it possible to get directly to the control code for the appliance. If the appliance is not controlled with the most frequent control code, which has been selected automatically, the user proceeds in the manner indicated previously by pressing a function button and successively various other buttons, such as the programme numbering buttons.

After these procedures have been performed successively, the remote control stands configured for the control of this appliance, and the user can use the remote control by pressing the various function buttons thereof in the conventional manner.

BRIEF DESCRIPTION OF THE DRAWING

In any event, the invention will be properly understood with the aid of the description which follows, with reference to the appended diagrammatic drawing whose single FIGURE is a block diagram illustrating the working of the remote control with a view to the configuring thereof.

DETAILED DESCRIPTION OF THE INVENTON

Figure 1:
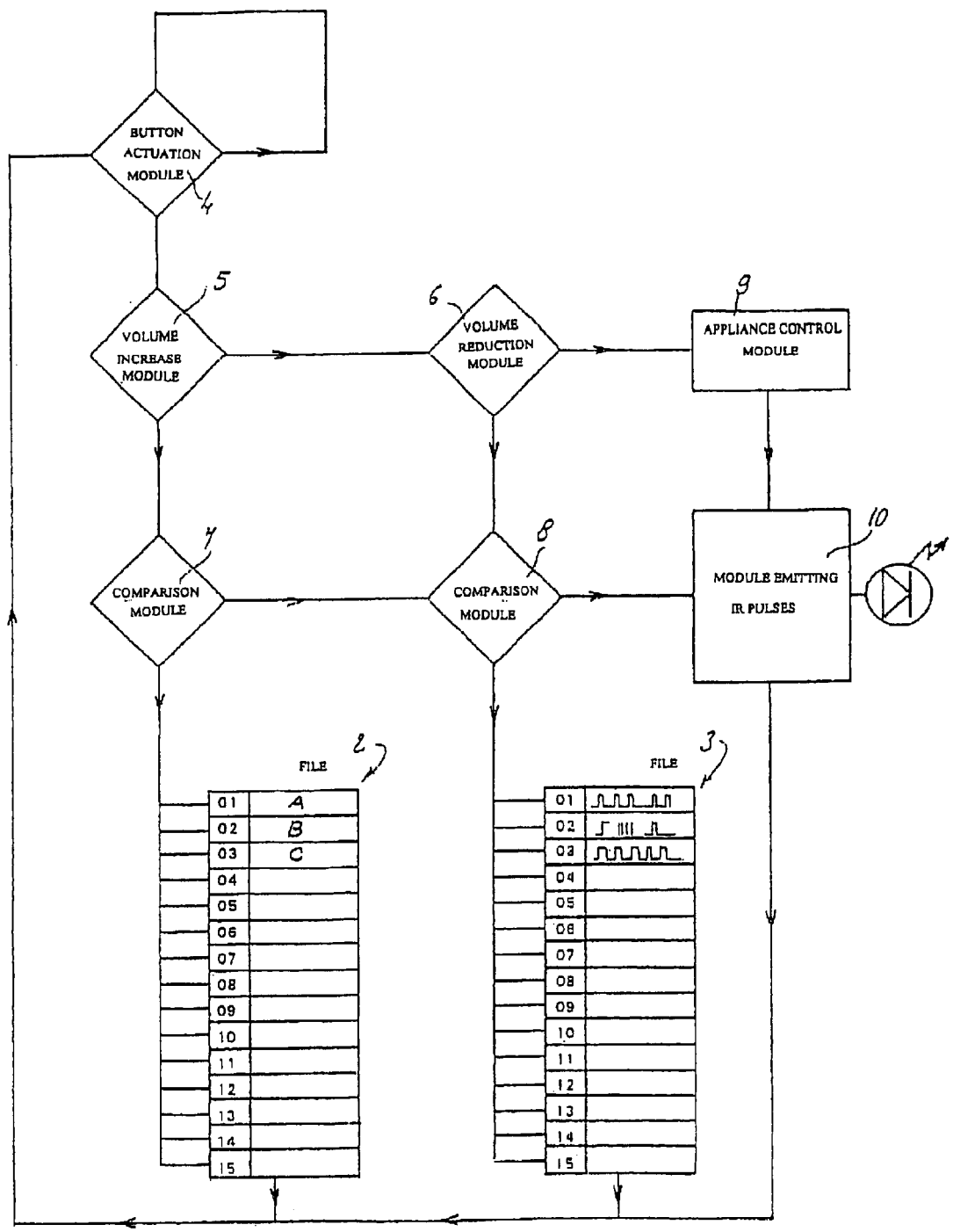

The single FIGURE of the appended drawing represents a first file 2 contained in the memory of a microprocessor which is included in the remote control, this first file containing the various makes A, B, C . . . of the appliances whose codes have been stored in the remote control. By way of example, fifteen areas are provided, corresponding to fifteen makes of appliances.

The block diagram also shows a file 3 which corresponds to the transmission codes of the various appliances belonging to one and the same make. By way of example, in the block diagram represented, there are fifteen areas corresponding to fifteen series of different codes, that is to say to fifteen appliances belonging to one and the same make.

There are as many files of transmission codes as there are makes of appliances stored in the file 2.

This schematic also shows a certain number of other functions managed by the microprocessor, namely a module for detecting actuation of any button of the remote control 4, a module 5 for detecting actuation of the volume increase button, a module 6 for detecting the reduction in volume as well as comparison modules 7 and 8 associated with the modules 5 and 6. This block diagram also illustrates a module 9 for controlling the various functions of an appliance, as well as a module 10 for emitting a train of infrared pulses for control of the appliance.

The configuring of the remote control in respect of an appliance of make C is as follows.

The microprocessor firstly tests whether certain buttons are activated or not. If no button is activated, it is possible for the user to press the function button for increasing the volume, this being detected by the module 5, monitored by the module 7, and making it possible to actuate a numerical button belonging to the remote control, in this instance the button 03 which corresponds to the appliances of make C. The information on the button to be actuated is provided by a printed document, delivered together with the remote control, or fixed to the back of the remote control. The microprocessor having stored the make of the appliance involved, it is necessary to retain the transmission code corresponding to the relevant appliance of this make.

According to one possibility, as soon as the make of the appliance has been selected from the file 2 of makes, the microprocessor automatically selects from the file 3 of control codes the control code 01, this being the most frequent code for the appliances of the relevant make. If the appliance cannot be controlled with the aid of this code, the user then presses a function button, such as the sound volume reduction button, and simultaneously a programme numbering button so as to select another control code. If no control is obtained, the user, continuing to exert pressure on the function button, exerts an action successively on the programme numbering buttons, until the remote control is active. As soon as the remote control is active, the user releases the pressure exerted on the volume reduction button and on the last numbering button for the relevant programmes, the transmission code corresponding to the appliance to be controlled then being selected by the microprocessor and remaining active in the latter's memory. Since the remote control is configured to the features of the appliance to be controlled, the user can act on the various functions to be initiated or to be modified, this control being received by the module 9 which transmits it to the emission module 10.

As is apparent from the foregoing, the invention affords a great improvement to the existing technique by providing an adaptable remote control, of simple structure, not requiring complicated manipulations by the user in order to adapt it to the type of appliance to be controlled.

As goes without saying, the invention is not limited to the sole form of execution of this remote control, described hereinabove by way of example; it embraces on the contrary all variants thereof. Thus, in particular, the microprocessor might not automatically select the most frequent control code, the user performing the selection of the control code from the file 3 only manually, or again the function buttons might consist not of the buttons for adjusting the sound volume but of other buttons, including specific buttons, without thereby departing from the scope of the invention.

What is claimed is:

1. Adaptable remote control for electrical appliances having several functions to be controlled, comprising:

a microprocessor possessing a first memory area containing a file of the makes of the main appliances on the market, and a memory area containing the files of the codes corresponding to the various appliances belonging to the various makes stored in the first file, means being provided so as to allow firstly the selecting of the make of the appliance to be controlled, then the selecting, within the files of codes of the appliances of this make, of the file containing the control codes for the relevant appliance;

wherein the selecting of the make of the appliance is achieved by pressing a predetermined button and simultaneously one or more other buttons, including the programmed numbering buttons, which each correspond to the identification of a make;

wherein after selecting a make from the file of the memory containing the makes of the main appliances on the market, the microprocessor automatically selects from the file of control codes, the most frequent code for the appliances of the relevant make.

2. Adaptable remote control according to claim 1, wherein the selecting of the codes corresponding to the type of appliance is achieved, after selecting the make, by pressing a second predetermined button and simultaneously one or more other buttons successively, including the programme numbering buttons, until the selecting of the codes of the relevant appliance is achieved.

* * * * *